United States Patent [19]

Upp

[11] Patent Number: 4,914,429
[45] Date of Patent: Apr. 3, 1990

[54] SWITCH COMPONENTS AND MULTIPLE DATA RATE NON-BLOCKING SWITCH NETWORK UTILIZING THE SAME

[75] Inventor: Daniel C. Upp, Southbury, Conn.
[73] Assignee: Transwitch Corp., Shelton, Conn.
[21] Appl. No.: 283,173
[22] Filed: Dec. 9, 1988
[51] Int. Cl.$^4$ ............................................. H04Q 3/42
[52] U.S. Cl. ...................... 340/825.800; 340/825.79;
 340/825.03; 370/58.1; 379/272
[58] Field of Search .................. 340/825.03, 825.79,
 340/825.8, 826, 827; 370/58, 84, 100; 379/271,
 272, 273; 307/236, 242, 269

[56] References Cited

U.S. PATENT DOCUMENTS

| | | | |
|---|---|---|---|
| 4,613,969 | 9/1986 | Draayer | 340/825.8 |
| 4,667,320 | 5/1987 | Onno et al. | 340/825.79 |
| 4,763,123 | 8/1988 | Yasuda | 340/825.03 |
| 4,807,280 | 2/1989 | Posner et al. | 379/272 |

*Primary Examiner*—Donald J. Yusko
*Assistant Examiner*—E. O. Pudpud
*Attorney, Agent, or Firm*—David P. Gordon

[57] ABSTRACT

A switching component preferably in integrated circuit form is provided. The switching component has a plurality of inlet and outlet data ports with associated inlet and outlet clock ports, a clock regenerator and a flip-flop for each outlet data port, and a switch matrix for coupling each inlet data port and its associated inlet clock port to any outlet data port and its associated outlet clock port. The clock regeneration means obtains the clock signal exiting the switching core and regenerates the clock signal waveshape. The flip-flop causes data exiting the switching core to be clocked out of the switching component synchronously with its associated regenerated clock signal according to the regenerated clock signal. A plurality of identical switching components can be arranged in a folded Clos arrangement having a plurality of stages to provide a desired switch network of any size. The use of multiple stages is permitted as the clock regeneration means associated with each port prevents signal dispersion and signal clock skew. The passing and switching of clock signals along with the data also permits the switching matrix to simultaneosuly handle lines having different rates, provided that a line of a given rate which is an input to the switching network must be connected to another line of the same rate which is an output of the switching network.

19 Claims, 4 Drawing Sheets

SWITCH COMPONENTS AND MULTIPLE DATA RATE NON-BLOCKING SWITCH NETWORK UTILIZING THE SAME

BACKGROUND

The subject matter of this invention is related to the subject matters of inventions entitled "Virtual Tributary Cross Connect Switch and Switch Matrix Utilizing the Same", Ser. No. 283,178, "System for Cross Connecting High Speed Digital Signals", Ser. No. 283,171, and "System for Cross Connecting High Speed Digital SONET Signals", Ser. No. 283,172 all of which are filed of even date, assigned to the assignee hereof, and both of which are hereby incorporated by reference herein.

This invention relates generally to switch components and non-blocking switching networks utilizing a plurality of switch components. More particularly, the invention relates to a switching component designed for use in the construction of non-blocking switching networks which permit the switching of digital signals having a plurality of data rates, including rates associated with at least DS-3, T1, and SONET telecommunication standards.

Several different switching architectures for permitting the connection of a plurality of bidirectional incoming lines to a plurality of bidirectional outgoing lines are well known to those skilled in the art. Examples of different switching network structures are described in Collins, Arthur A., et al., *Telecommunications A Time For Innovation*, Chapter 2 (Merle Collins Foundation, Dallas, Tex.; 1972). Depending on the particular function of the switch network in a system, it is sometimes desirable to utilize a strictly "non-blocking" switch network; i.e. a switch network which guarantees that any pair of ports which are not connected may be connected via a free path which always exists regardless of the connection state of the other ports. Such a non-blocking switch network is particularly advantageous in applications such as "cross-connect" systems in telephone trunk networks. Among the known architectures for such "non-blocking" switch networks is a "folded Clos" structure which utilizes switching stages. In a folded Clos structure, each stage must have twice as many output ports as input ports, except for the last "reflecting" stage whose ports equal the number of output ports from the previous stage.

In telecommunication systems presently utilized, it is common to have DS-3 trunks comprising twenty-eight T1 lines (DS-3 and T1 being well documented ANSI standards). Central telephone offices receive the DS-3 and T1 lines and use non-blocking cross-connect switches to perform cross-connect functions. These cross-connect functions typically include: connecting between DS-3 signals where the various signals may be carried on lines entering or leaving a building or may terminate on equipment internal to the building; connecting between DS-1 signals where the various signals may be carried on lines entering or leaving a building or may terminate on equipment internal to the building; and connecting between DS-1 signals were DS-1 signals may be contained in a DS-3 signal or on external lines or on internal equipment. Typically, the data being transmitted over the DS-3 trunk is a bipolar signal which was formed at a multiplexer by taking a binary stream and encoding according to the B3ZS (binary with three zero substitution) standard. Thus, the actual signal being switched in the central office is essentially an analog voltage representation of a DS-3 signal, and mechanical analog switches are utilized for accomplishing the switching function. When the data in the DS-3 format reaches its desired destination it is decoded to produce the original binary (digital) stream. Prior to decoding, however, the clock of the signal must be recovered via a clock recovery circuit so that a decision may be made on the value of the incoming information.

With the advent of the new SONET standards, and the existence of DS-3, DS-0, DS-1, and SPT standards, it would clearly be desirable to have a switching architecture which is capable of handling signal data regardless of the standards by which the signal data was formed. Thus, for example, it would be desirable to be able to receive data from a DS-3 trunk and segment the data into various components which might then be sent out over lines utilizing the DS-1, or SPT standards. In fact, such a switching architecture is described and claimed in the previously referenced copending patent application entitled "System for Cross Connecting High Speed Digital Signals" (Docket #TRA-001). As part of that switching architecture, it is desirable to include a non-blocking switching network which can connect any like signals from among a plurality of groups of like signals regardless of speed; i.e. DS-3 connected to DS-3 concurrently with DS-1 connected to DS-1

SUMMARY OF THE INVENTION

It is therefore an object of the invention to provide a switching component designed to be used in the construction of a non-blocking switching network of desired size.

It is a further object of the invention to provide a non-blocking switching network capable of connecting a line of a first rate to another line of the first rate, while concurrently connecting a line of a second rate to another line of the second rate.

It is another object of the invention to provide a controllable digital non-blocking switching network capable of handling the switching of a plurality of different rate lines.

In accord with the objects of the invention, a switching component is provided and broadly comprises: a plurality of inlet and outlet data ports with associated inlet and outlet clock ports, associated clock regeneration means, and associated timing means; and connection means for connecting each inlet data port and its associated inlet clock port to any outlet data port and its associated outlet clock port. The clock regeneration means obtains the clock signal exiting the connection means and regenerates the clock signal waveshape. The timing means causes data exiting a data outlet port to be clocked out of the switching component synchronously with its regenerated clock signal according to such regenerated clock signal.

A plurality of switching component can be utilized to further provide a non-blocking switching network of desired size. Preferably, the switching components are arranged in a folded Clos arrangement having at least two stages. In each stage except for the last reflecting stage, the switching components of the invention are arranged to have at least $2n=1$ (and preferably at least $2n$) as many ports connected to the next stage as connected to a previous stage, where n is the number of ports connected to a previous stage. The switching network may have as many stages as desired, as the clock regeneration means associated with each port prevents signal dispersion and signal clock skew. The passing and switching of clock signals along with the data also permits the switching network to simultaneously handle lines having different rates, provided that a line of a given rate which is an input to the switching network must be connected to another line of the same rate which is an output of the switching network.

In the preferred embodiment, the switching network can handle bit rates from 64 Kbit/sec to 60 Mbit/sec. Also, in the preferred embodiment, each switching component comprises sixteen four line ports, each four line port providing duplex data paths and associated clocks. Thus, up to eight duplex paths may be established per switching component. In addition, simplex paths may be established, and the switching component can provide a multicasting function with any inlet port sending a signal out over from two to sixteen outlet ports. Path control and system maintenance are accomplished by an external control system which interfaces with the switching components via an eight bit parallel control bus.

Additional objects and advantages of the invention will become apparent to those skilled in the art upon reference to the detailed description in conjunction with the provided Figures.

DETAILED DESCRIPTION OF THE PREFERRED EMBODIMENT

Figure 1:
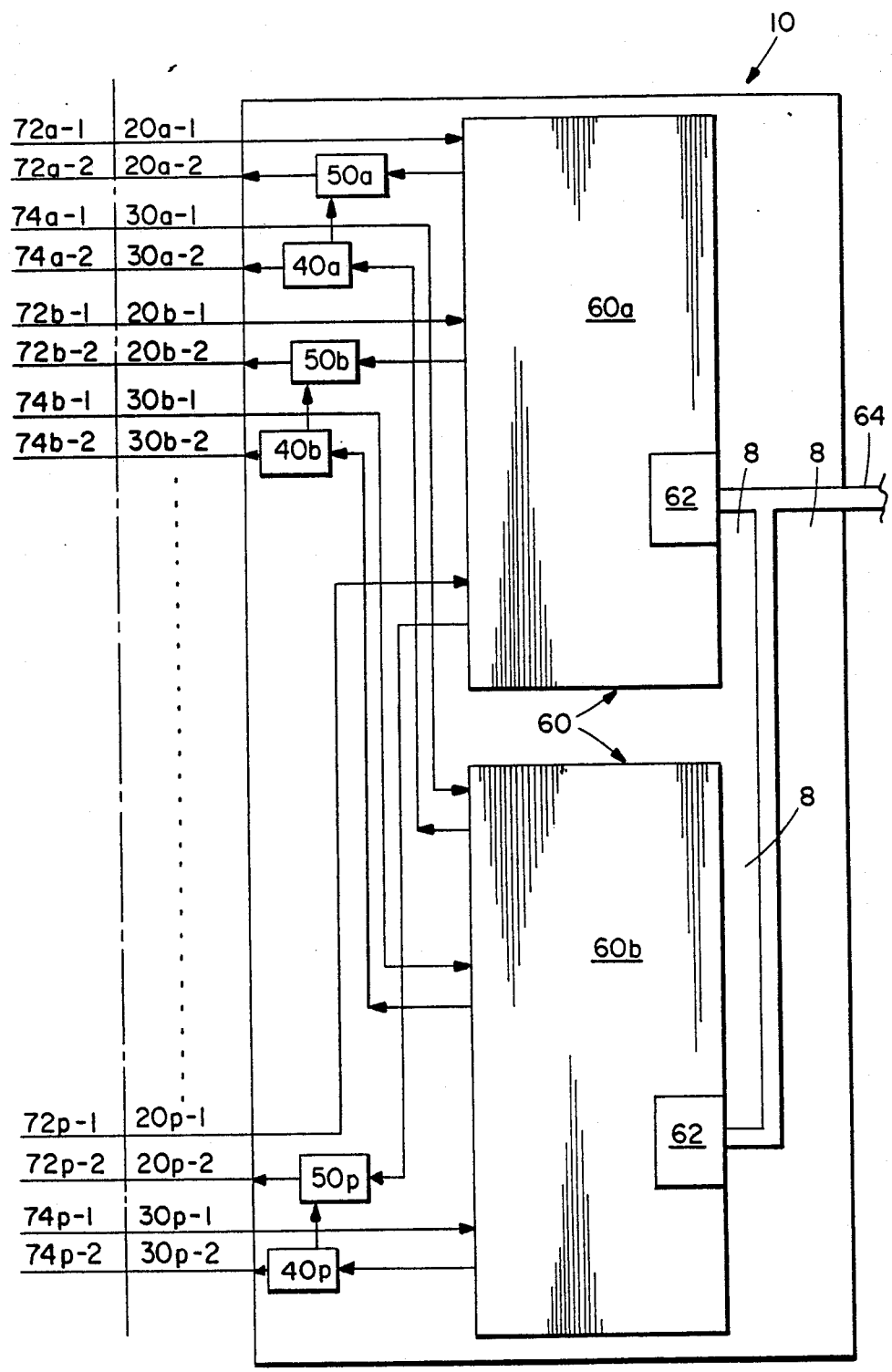
FIG. 1 is a block diagram of the architecture of the switching component of the invention.

Turning to FIG. 1, a block diagram of the preferred switching component 10 of the invention is seen. The switching component 10 is preferably a CMOS integrated circuit device which includes thirty-two data ports (for sixteen bidirectional lines) 20a-1, 20a-2, 20b-1, 20b-2, ..., 20p-1, 20p-2, thirty-two clock ports 30a-1, 30a-2, 30b-1, 30b-2, ..., 30p-1, 30p-2 (one for each data port), sixteen clock regenerators 40a, 40b, ..., 40p (one for each outgoing or outlet data port), sixteen flip-flops 50a, 50b, ..., 50p (one for each clock generator), and a logical switching matrix 60 for connecting ports in a desired fashion. Each switching component 10 also preferably includes a control interface 62 which controls switching matrix 60 in accord with instructions received over a control bus 64 from a system controller (not shown). As the control algorithms and the system controller are not part of this invention, they are not further described herein.

Inputs into switching component 10 are from control bus 64 as well as from sixteen inlet (input) data lines 72a-1, 72b-1, ..., 72p-1 which carry data, and sixteen inlet clock lines 74a-1, 74b-1, ... 74p-1 which carry clock signals associated with the data signals. The input data signals are preferably digital signals which were generated after clock recovery, bit decision and decoding of an analog signal, and the associated input clock signals are the clock signals obtained from that clock recovery.

Outputs from switching component 10 are onto sixteen outlet (output) data lines 72a-2, 72b-2, ..., 72p-2 which carry outgoing data, and from sixteen outlet (output) clock lines 74a-2, 74b-2, ... 74p-2 which carry clock signals associated with the data signals. The output data signals are digital signals which have been appropriately switched, while the output clock signals are clock signals which have been regenerated by the clock regenerators 40.

Figure 2:
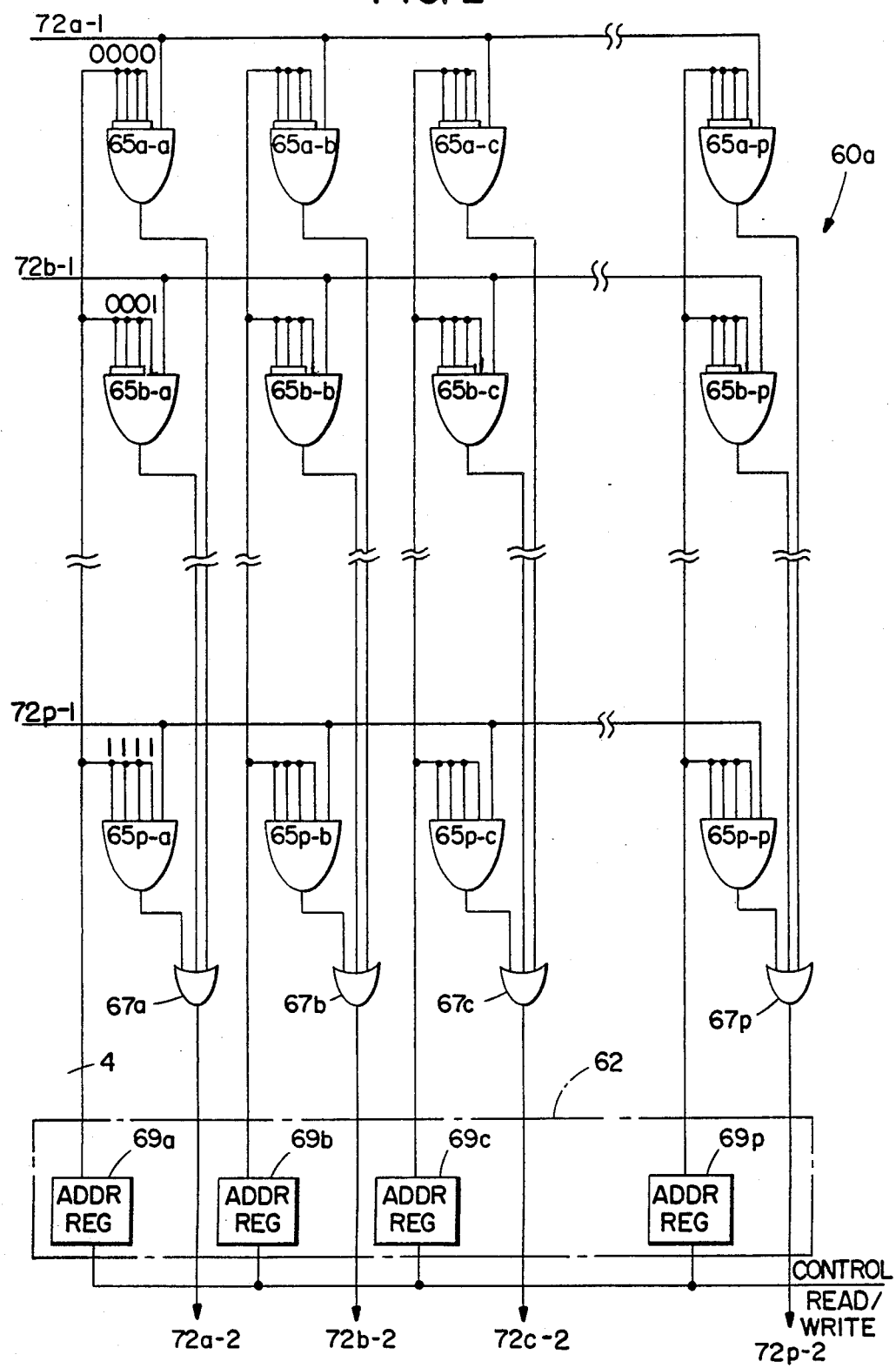
FIG. 2 is a logic diagram of a section of a switching matrix for use with the switching component of the invention.

Switching matrix 60 is preferably comprised of duplicate matrices denoted by 60a and 60b; a first matrix 60a utilized for switching data signals, and the second matrix 60b utilized for switching clock signals associated with the data signals. Both matrices 60a and 60b may be comprised according to the teachings of the art. For example, as seen in FIG. 2, a plurality of AND gates 65a-a, 65a-b, 65a-c, ..., 65a-p, 65b-a, 65b-b, ..., 65b-p, ..., 65p-a, ..., 65p-p, are used to cross-connect any of the data inlet lines 72a-1, ..., 72p-1, to any of the data outlet lines 72a-2, ..., 72p-2. Whether AND gates 65 permit the data from the data inlet lines through to the outlet lines is under control of the address registers 69a, ... 69p which comprise the control interface 62. The address registers enable an AND gate by sending a four bit address code simultaneously to the sixteen AND gates in a column. The AND gates are arranged with different input inverters so that a particular code will enable only a single AND gate in the matrix column. The data input to the enabled AND gate is passed to the OR gate 67 for that column (OR gates 67 are coupled to all AND gate outputs in a column) and the OR gate passes the data signal from the enabled AND gate to the output.

With the provided switch matrix, a single input signal may be broadcast on all output lines (multicasting) by simultaneously enabling all sixteen AND gates of a single row. A "loopback" may be accomplished by enabling an AND gate along a diagonal of the matrix (e.g. 65a-a or 65b-b, etc.) which causes the signal of an input line to be sent back out over its related output line. Of course, standard cross-connections may be arranged by configuring switch matrix 60a as desired. With sixteen duplex ports, up to eight simultaneous duplex paths may be set up within the switching component 10. As will be discussed hereinafter, simplex paths may also be established. However, regardless of the manner in which the data matrix 60a is configured, the clock matrix 60b should configured identically so that the clock associated with particular data travels with that data through the switching component 10.

Figure 3:
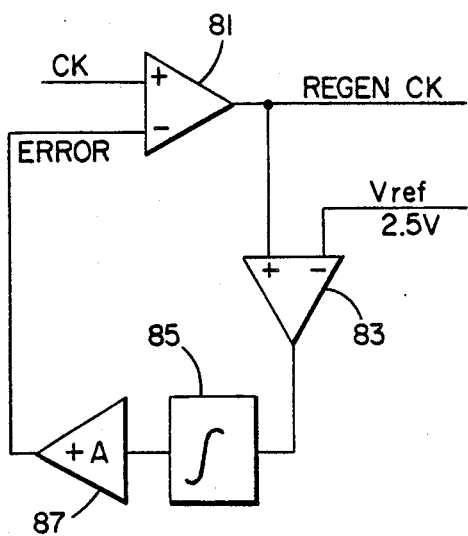
FIG. 3 is a block diagram of a clock regeneration circuit for use with the switching component of the invention.

Details of the preferred clock regenerator (also called clock shaping) circuit 40 are seen in FIG. 3, although any effective clock regenerator may be utilized. The clock regenerator 40 of FIG. 3 is seen to include two voltage comparators 81 and 83, an integrator 85, and a feedback loop gain amplifier 87. The clock signal received from one of clock lines 74-1, via one of clock ports 30-1 and clock matrix 60b is input as the positive signal to comparator 81, while the feedback signal which is generated according to techniques belowdescribed is input as the negative signal. Typically, the clock signal varies between zero and five volts for a CMOS device. The output of the voltage comparator 81 is provided as the output of the clock regenerator circuit 40. However, the output is also fed to the positive input of comparator 83 which compares the output to a 2.5 V signal fed into it negative input. The length of time the output signal is greater than 2.5 V is measured by integrator 85 which provides an error signal amplified by feedback gain amplifier 87 to voltage comparator 81. Thus, where the duty cycle of the output signal is too great, comparator 83 provides a positive signal for a longer time than a negative signal, such that integrator 85 provides a larger signal to amplifier 87 and to the negative feedback input of voltage comparator 81. As a result, the duty cycle output by comparator 81 is decreased. Of course, where the duty cycle is too small, the opposite effect is accomplished by the clock regenerator.

As indicated in FIG. 1, the output of the clock regeneration circuit 40 is sent to the desired clock output port 30-2. In addition, the output of the clock regeneration circuit is fed to the clocking input of a D-type flip-flop 50 which is arranged to receive at its D input the data from data matrix 60a. Thus, the regenerated clock output from the regenerator 40 not only acts as the regenerated clock output for the switching component 10, but acts to cause the data to be clocked out of the switching component synchronously with its associated clock.

Figure 4:
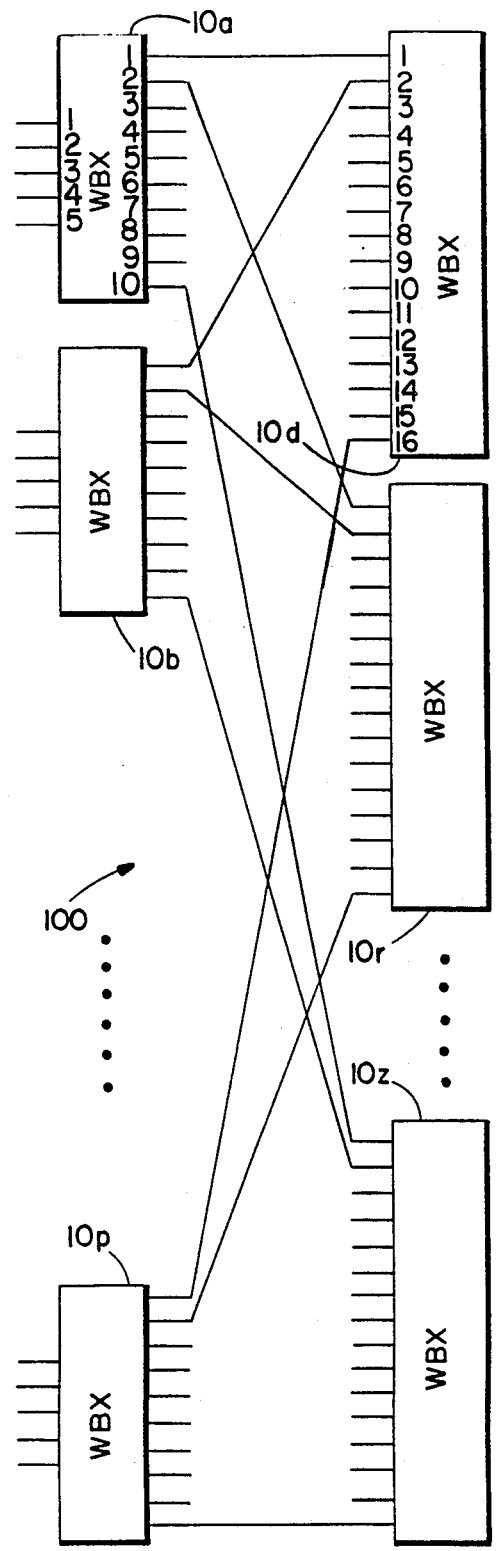
FIG. 4 is a block diagram of a eighty port two stage non-blocking switching network indicative of the utilization of twenty-six of the switching components of FIG. 1.

A plurality of the preferred switching components 10 detailed in FIG. 1 may be used to provide a multiple stage non-blocking switching network, for example, a two-stage eighty (for line; data/clock duplex) port folded Clos network 100 utilizing twenty-six switching components 10a - 10z is seen in FIG. 4. As arranged, each switching component of the first stage has five duplex ports acting as input/outputs to the network, and sixteen switching components 10a - 10p are required to provide the eighty terminal duplex ports. With five input ports in each switching component, the folded Clos network requires at least nine outputs to the next stage in order to be non-blocking, although ten are typically provided. Thus, fifteen of the sixteen available ports are utilized in each first stage switching component. Also, with sixteen switching components having ten duplex outputs each, the second reflecting stage must provide one hundred sixty duplex ports. With sixteen ports available per switching component, ten additional switching components 10q - 10z are utilized to act as the reflecting stage of the folded Clos network. Lines between the various ports of the various switching components as seen in FIG. 3 are indicative of typical paths through the network. Of course, with the provided structure, any of the provided eighty input ports can be connected to any (or all) of the eighty output ports. Also, if properly programmed, eighty different sets of connections each having its own clock and hence its own bit rate may be arranged with the provided switching network of FIG. 4.

Figure 5:
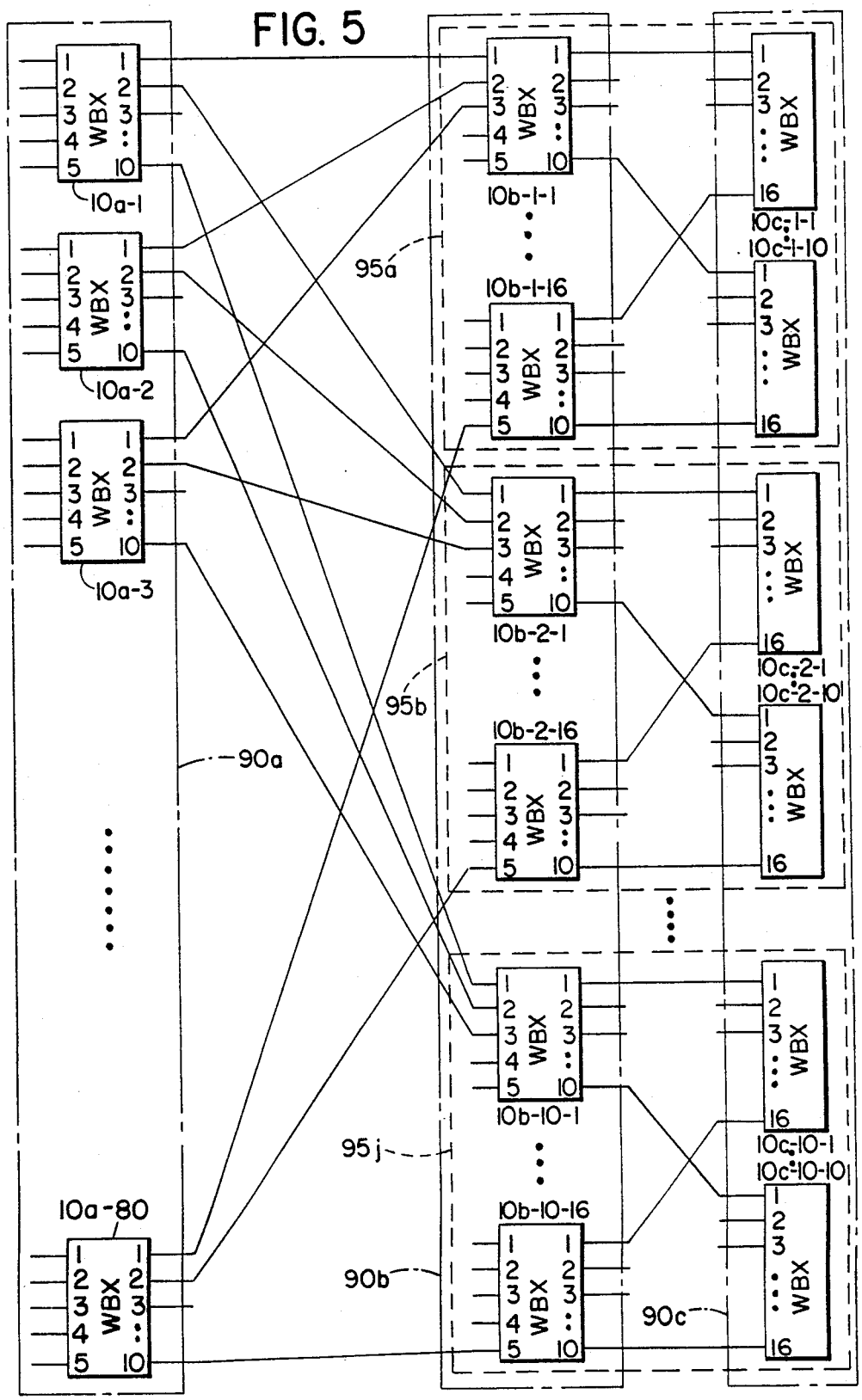
FIG. 5 is a block diagram of a four hundred port three stage non-blocking switching network indicative of the utilization of three hundred forty of the switching components of FIG. 1.

While FIG. 4 illustrates an eighty duplex port non-blocking switching network, FIG. 5 illustrates a four hundred duplex port non-blocking network. Utilizing the preferred switching component which has sixteen duplex (four line) ports, eighty switching components 10a1 - 10a80 are utilized at the first stage 90a to provide four hundred duplex data ports. Of course, in order to provide a non-blocking folded Clos network, the four hundred duplex data ports require eight hundred duplex outputs to the second stage 90b. Because the switching network of FIG. 4 provides an eighty output data port switching network, it will be appreciated that ten such second stage - third stage groupings 95a through 95j can be utilized to complete the circuit. In other words, the second stage would consist of one hundred and sixty switching components 10b-1-1 through 10b-10-16 (ten times sixteen to provide eight hundred; five times one hundred and sixty ports), while the third stage 90c would consist of one hundred switching components 10c-1-1 through 10c-10-10 to provide one thousand six hundred (sixteen times one hundred ports) reflection ports.

There have been described and illustrated herein a switching component, and non-blocking switching networks utilizing a plurality of such switching components. While particular embodiments of the invention have been described, it is not intended that the invention be limited thereby, as it is intended that the invention be broad in scope. Thus, for example, while a switching component utilizing sixteen four line (duplex data and clock) ports has been described, the switching components could be arranged with a different number of ports. Likewise, while particular circuitry and/or logic diagrams were provided for the clock regeneration means, the timing means, and the switching matrix connection means, those skilled in the art will appreciate that the particular circuitry is not critical, provided that the clock information is passed through the switching component in conjunction with the data, is regenerated at the output of each stage, and is used to clock out the data so as to synchronize the associated clock and data information. In fact, the circuitry may take the form of an integrated circuit (CMOS or otherwise), discrete components, or a combination of the two. Further, those skilled in the art will appreciate that while certain building blocks of a set number of switching components in a certain (folded Clos) non-blocking format was described, other inter arrangements of the switching components could be utilized to provide any of many desirable functions.

It should also be understood by those skilled in the art that the terminology utilized in the specification is intended to be interpreted liberally. For example the terms "inlet" and "input" are used interchangeably as are the terms "outlet" and "output". Further, a "port" on the switching component might be usable either as an inlet or outlet port depending on the configuration of the switching component. Moreover, the term "port" is intended to be broad in that a port may be located internally to, or at the interface of component. Similarly, the term "clock regeneration means" is intended to encompass wave shaping means, etc. Therefore, it will be apparent to those skilled in the art that yet other changes and modifications may be made to the invention as described without departing from the scope of the invention as so claimed.

I claim:

1. A switching component comprising:
    (a) a plurality of data ports, with a first plurality of said data ports designated data inlet ports and a second plurality of said data ports designated data outlet ports;
    (b) a plurality of clock ports associated with the plurality of data ports, with a first plurality of said clock ports designated clock inlet ports and a second plurality of said clock ports designated clock outlet ports;

(c) connection means for coupling any of said inlet data ports to any of said outlet data ports and for associatingly coupling a clock inlet port to a respective clock outlet port;

(d) a plurality of clock regeneration means associated with said plurality of clock outlet ports, each clock regeneration means for obtaining a clock signal exiting said connection means and for regenerating said clock signal to provide a regenerated clock signal to an associated clock outlet port; and (e) a plurality of timing means associated with said plurality of clock regeneration means, each timing means for causing data exiting said connection means to be clocked out of said switching component in conjunction with said regenerated clock signal according to said regenerated clock signal.

2. A switching component according to claim 1, wherein:

each of said plurality of timing means includes a flip-flop means having two inputs and an output, with a first of said two inputs coupled to said connection means to receive data, and a second of said two inputs coupled to said clock regeneration means to receive said regenerated clock signal, wherein an edge of said regenerated clock signal causes said data input to said first of two inputs to transfer to said output, said output coupled to a data outlet port.

3. A switching component according to claim 1, wherein:

said plurality of data ports comprises sixteen data inlet ports and sixteen data outlet ports, and said plurality of clock ports comprises sixteen clock inlet ports and sixteen clock outlet ports.

4. A switching component according to claim 1, wherein:

said connection means comprises a switch matrix having means for coupling any of said data inlet ports simultaneously to a plurality of data outlet ports and for coupling an associated clock inlet port simultaneously to an associated plurality of clock outlet ports.

5. A switching component according to claim 1, further comprising:

(f) control interface means for receiving control information and for causing said connection means to assume a configuration accordingly.

6. A switching component according to claim 5, wherein:

each of said plurality of timing means includes a flip-flop means having two inputs and an output, with a first of said two inputs coupled to said connection means to receive data, and a second of said two inputs coupled to said clock regeneration means to receive said regenerated clock signal, wherein an edge of said regenerated clock signal causes said data input to said first of two inputs to transfer to said output, said output coupled to a data outlet port.

7. A switching component according to claim 6, wherein:

said connection means comprises a switch matrix having means for coupling any of said data inlet ports simultaneously to a plurality of data outlet ports and for coupling an associated clock inlet port simultaneously to an associated plurality of clock outlet ports.

8. A switching component according to claim 1, wherein:

a first of said inlet data ports accepts a data signal of a first phase and at a first rate, wherein a clock signal associated with said first rate and phase is accepted at an inlet clock port associated with said first inlet data port, and a second of said inlet data ports accepts a data signal of a second phase and at a second rate, wherein a clock signal associated with said second rate and phase is accepted at an inlet clock port associated with said second inlet data port.

9. A switching network comprising:

a plurality of interconnected switching components, each switching component comprising, a plurality of data ports, with a first plurality of said data ports designated data inlet ports and a second plurality of said data ports designated data outlet ports, a plurality of clock ports associated with the plurality of data ports, with a first plurality of said clock ports designated clock inlet ports and a second plurality of said clock ports designated clock outlet ports;

connection means for coupling any of said inlet data ports to any of said outlet data ports and for associatingly coupling a clock inlet port to a respective clock outlet port, a plurality of clock regeneration means associated with said plurality of clock outlet ports, each clock regeneration means for obtaining a clock signal exiting said connection means and for regenerating said clock signal to provide a regenerated clock signal to an associated clock outlet port, and a plurality of timing means associated with said plurality of clock regeneration means, each timing means for causing data exiting said connection means to be clocked out of said switching component in conjunction with said regenerated clock signal according to said regenerated clock signal, wherein at least one data outlet port and associated clock outlet port of a first of said plurality of interconnected switching components is coupled to at least one data inlet port and associated clock inlet port of a second of said plurality of interconnected switching components.

10. A switching network according to claim 9, wherein:

said switching network comprises a non-blocking switching network.

11. A switching network according to claim 10, wherein:

said switching network is arranged to provide a folded Clos switching network.

12. A switching network according to claim 9, wherein:

said plurality of switching components are arranged in at least two stages, wherein a switching component in a first of said two stages is arranged with a first number of data inlet and outlet ports and associated clock inlet and outlet ports interfacing to lines outside said switching network and a second number equal to at least twice said first number of data inlet and outlet ports and associated clock inlet and outlet ports coupled to respective data inlet ports and clock inlet ports and data outlet ports and clock outlet ports of at least one switching component in a second stage.

13. A switching network according to claim 12, wherein:
   each switching component includes sixteen data inlet ports, sixteen data outlet ports, sixteen clock inlet ports and sixteen clock outlet ports, and
   each switching component in said first stage is arranged with five data inlet and outlet ports and five clock inlet and outlet ports interfacing to lines outside said switching network, and at least ten data inlet and outlet ports and ten clock inlet and outlet ports coupled to respective data inlet ports and clock inlet ports and data outlet ports and clock outlet ports of switching components in said second stage.

14. A switching network according to claim 13, wherein:
   said first stage comprises sixteen switching components having a total of eighty data inlet and outlet ports interfacing to lines outside said switching network, and said second stage comprises at least ten switching components, each of said ten switching components of said second stage having one of its sixteen inlet data and clock ports coupled to an outlet data and clock port of each of said sixteen first stage components.

15. A switching network according to claim 9, wherein:
   each of said switching components further includes control interface means for receiving control information and for causing the connection means of that switching means to assume a configuration accordingly, and
   each of said plurality of timing means of said switching components includes a flip-flop means having two inputs and an output, with a first of said two inputs coupled to said connection means to receive data, and a second of said two inputs coupled to said clock regeneration means to receive a regenerated clock signal, wherein an edge of said regenerated clock signal causes said data input to said first of two inputs to transfer to said output, said output coupled to a data outlet port of that switching component.

16. A switching network according to claim 15, wherein:
   said connection means of each of said switching components comprises a switch matrix including means for coupling any of said data inlet ports of that switching component simultaneously to a plurality of data outlet ports of that switching component and for coupling an associated clock inlet port simultaneously to an associated plurality of clock outlet ports of that switching component.

17. A switching network according to claim 12, wherein:
   each of said switching components further includes control interface means for receiving control information and for causing the connection means of that switching means to assume a configuration accordingly, and
   each of said plurality of timing means of said switching components includes a flip-flop means having two inputs and an output, with a first of said two inputs coupled to said connection means to receive data, and a second of said two inputs coupled to said clock regeneration means to receive a regenerated clock signal, wherein an edge of said regenerated clock signal causes said data input to said first of two inputs to transfer to said output, said output coupled to a data outlet port of that switching component.

18. A switching network according to claim 17, wherein:
   said connection means of each of said switching components comprises a switch matrix including means for coupling any of said data inlet ports of that switching component simultaneously to a plurality of data outlet ports of that switching component and for coupling an associated clock inlet port simultaneously to an associated plurality of clock outlet ports of that switching component.

19. A switching network according to claim 9, wherein:
   a first of said inlet data ports of a first of said interconnected switching components accepts a data signal of a first phase and at a first rate, wherein a clock signal associated with said first rate and phase is accepted at an inlet clock port associated with said first inlet data port of a said first of said interconnected switching components, and
   a second of said inlet data ports of any of said plurality of interconnected switching components accepts a data signal of a second phase and at a second rate, wherein a clock signal associated with said second rate and phase is accepted at an inlet clock port associated with said second inlet data port of any of said plurality of interconnected switching components.

* * * * *